(12) United States Patent
Henry

(10) Patent No.: US 7,525,365 B1
(45) Date of Patent: Apr. 28, 2009

(54) SYSTEM AND METHOD FOR PROVIDING AN OFFSET VOLTAGE MINIMIZATION CIRCUIT

(75) Inventor: Paul Michael Henry, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 240 days.

(21) Appl. No.: 11/124,758

(22) Filed: May 9, 2005

(51) Int. Cl.
*H03L 5/00* (2006.01)
(52) U.S. Cl. ...................... 327/307; 327/539
(58) Field of Classification Search ............... 327/307, 327/539, 91, 94
See application file for complete search history.

(56) References Cited

U.S. PATENT DOCUMENTS

| | | | | |
|---|---|---|---|---|
| 3,988,689 A | * | 10/1976 | Ochi et al. | 330/9 |
| 4,138,649 A | * | 2/1979 | Schaffer | 330/9 |
| 4,355,285 A | * | 10/1982 | Kelley et al. | 330/9 |
| 4,939,516 A | * | 7/1990 | Early | 341/143 |
| 5,041,794 A | * | 8/1991 | McMorrow et al. | 330/51 |
| RE34,428 E | * | 11/1993 | George et al. | 341/118 |
| 5,334,944 A | * | 8/1994 | Hirakata | 330/6 |
| 5,410,270 A | * | 4/1995 | Rybicki et al. | 330/9 |
| 5,623,220 A | * | 4/1997 | Betti et al. | 327/79 |
| 5,844,427 A | * | 12/1998 | Theus et al. | 327/51 |
| 6,842,486 B2 | * | 1/2005 | Plisch et al. | 375/247 |
| 7,095,667 B2 | * | 8/2006 | Baker | 365/207 |
| 7,161,428 B2 | * | 1/2007 | Mendenhall | 330/251 |

* cited by examiner

*Primary Examiner*—Kenneth B. Wells

(57) ABSTRACT

A system and method is disclosed for providing an offset voltage minimization circuit for an amplifier circuit. The present invention comprises a flip flop zero amplifier circuit that is capable of operating in a first configuration during a first period of time to obtain a first value of offset voltage. The flip flop zero amplifier circuit is also capable of operating in a second configuration during a second period of time to obtain a second value of offset voltage that has a polarity that is opposite to that of the first value of offset voltage. The two values of offset voltage are then averaged to obtain an average value of offset voltage that is approximately zero volts. The invention may be advantageously employed in a switching power supply circuit.

21 Claims, 5 Drawing Sheets

SYSTEM AND METHOD FOR PROVIDING AN OFFSET VOLTAGE MINIMIZATION CIRCUIT

TECHNICAL FIELD OF THE INVENTION

The present invention relates generally to integrated circuits and, more particularly, to a system and method for providing an offset voltage minimization circuit.

BACKGROUND OF THE INVENTION

A major goal in the design and manufacture of electronic circuitry is to increase the accuracy and precision of the operation of integrated circuits. In some instances the accuracy and precision of an integrated circuit may be increased by minimizing the error that is present in an input signal to an amplifier circuit. For example, consider the operation of a switching power supply circuit such as a direct current (DC) to direct current (DC) switching regulator. A block diagram of an exemplary prior art voltage mode compensation switching power supply circuit 100 is illustrated in FIG. 1.

The precision of voltage mode compensation switching power supply circuit 100 is limited by the accuracy of the internal voltage reference ($V_{REF}$) and the input errors to the pulse width modulation (PWM) error amplifier 110. These errors are primarily due to the input referred offset voltage of PWM error amplifier 110 and the bandgap error amplifier 120. The source of these errors is well documented and understood.

This particular problem is much worse with complementary metal oxide semiconductor (CMOS) amplifiers because the matching of the CMOS transistors is significantly poorer than the matching of similarly sized bipolar transistors. This is particularly the case for CMOS transistors that are biased at low currents.

These offset errors (and the resulting temperature drift) can significantly affect the output accuracy of a switching power supply circuit. These offset errors may decrease the accuracy from a level of one percent (1%) over temperature to a level of five percent (5%) over temperature. The importance of accuracy requirements is continually increasing as power supply voltages continue to decrease. This is an application that is especially well suited for CMOS transistor switching power supply circuits.

The switching power supply circuit 100 shown in FIG. 1 can be thought of as a controlled switch with a duty cycle equal to the ratio of the output voltage ($V_{OUT}$) to the input voltage ($V_{IN}$). In switching power supply circuit 100 the ramp generator 130 creates a periodic waveform. The PWM error amplifier 110 drives the feedback voltage ($V_{FB}$) to be equal to the reference voltage ($V_{REF}$) by modulating the percentage of time that the switch ($S_1$) is on during each period.

As previously mentioned, the duty cycle (in the steady state) will be very near the value of the ratio of output voltage to the input voltage (i.e., $V_{OUT}/V_{IN}$). The offset voltage of the PWM error amplifier 110 directly impacts the accuracy of the switcher output voltage ($V_{OUT}$). The offset voltage of the PWM error amplifier 110 appears as an error of the reference voltage ($V_{REF}$).

The primary source of error in the reference voltage (VREF) is due to the bandgap error amplifier 120 that is used to drive the bandgap core. The problem is again much worse in CMOS transistor switching power supply circuits because of the previously mentioned poor matching of CMOS transistors and because of a lack in many technologies of quality 3 terminal bipolar transistors (that have improved matching characteristics).

FIG. 2 is a block diagram illustrating a prior art complementary metal oxide semiconductor (CMOS) bandgap voltage reference circuit 200. CMOS bandgap voltage reference circuit 200 comprises terminal bipolar transistors Q1 and Q2. In the example shown in FIG. 2, resistor $R_1$ has a value of five and seven tenths kilohms (5.7 kΩ). Resistor $R_2$ has a value of fifty six and six tenths kilohms (56.6 kΩ). Resistor $R_3$ also has a value of fifty six and six tenths kilohms (56.6 kΩ). In this example, the emitter area of transistor Q1 is nine (9) times the emitter area of transistor Q2.

CMOS bandgap voltage reference circuit 200 illustrates how a basic CMOS bandgap voltage reference circuit with an error amplifier (A1) having five millivolts (5 mV) of offset will be mis-biased by approximately forty seven millivolts (47 mV) at the reference output. That is, a five millivolt (5 mV) offset voltage ($V_{OS}$) in the error amplifier (A1) creates a forty seven millivolt (47 mV) error at the bandgap voltage output ($V_{BG}$). Even a small offset voltage in the error amplifier (A1) can cause a big error in the bandgap voltage ($V_{BG}$). This, in turn, can cause a poor voltage reference temperature coefficient because the bandgap is not biased at the correct voltage for the ideal temperature coefficient.

There are always initial errors due to the mismatch between the critical matching transistors of the error amplifier (A1) and the resulting degraded temperature performance. In addition to these initial errors, there are also very significant errors attributed to the assembly shift of the integrated circuit chip. It seems that the assembly stresses create offset voltages in CMOS amplifiers on the order of (or even greater than) five millivolts (5 mV) at a two sigma level. This assembly shift is simply a change in the matching of those same critical transistors that had an impact on the initial input offset voltage. The errors that result at the reference output voltage are very significant because the bandgap design multiplies those errors by almost a factor of ten (10) depending on the ratio of the emitter areas of transistors Q1 and Q2. Similarly, the errors that result in the input offset voltage of the PWM error amplifier are also significant.

The problem to be solved is one of removing or reducing the errors in the output voltage ($V_{OUT}$) of switching power supply circuit 100 by removing or reducing the errors from the offset voltages that are due to the PWM error amplifier 110 and the bandgap error amplifier 120.

There have been a number of prior art approaches to this problem. The various prior art approaches all attempt to improve the overall accuracy of switching power supply circuit 100 by reducing the input offset voltage errors that are caused by the PWM error amplifier 110 and the bandgap error amplifier 120. In each case an attempt was made to reduce the offset voltage to a value of voltage that was as close as possible to zero volts.

One such prior art approach employs laser trimming to trim out the offset errors. Laser trimming is somewhat effective but requires some circuit element to trim such as thin film resistors or metal links. Laser trimming adds circuit complexity and potentially adds process complexity. Another disadvantage of laser trimming is that it requires the added cost and the added manufacturing complexity of the laser trim operation. The laser trim operation is performed on a finished wafer.

Another disadvantage of laser trimming is that it does not eliminate the assembly stress contribution to the offset error. The assembly stress contribution can be almost as large as the initial offset errors. Unless the circuit elements are tested over temperature, there is no provision for correcting (or even detecting) those circuit elements with poor temperature drift performance. That means that all circuit elements must be tested over temperature in order to find the bad circuit elements.

Another prior art approach employs electrically erasable programmable read only memory (EEPROM) trimming. The EEPROM trimming method is an improvement in that the trimming process can be carried out post package. This eliminates the assembly shift component of the error. A major disadvantage is that EEPROM trimming requires additional manufacturing steps and additional cost. There is a significant amount of circuit complexity in an EEPROM memory array. In addition, the EEPROM trimming method does not address temperature performance. Test time and test cost is also an issue with the EEPROM trimming method. Some type of test mode is required in order to "bring out" the offsets so that they can be trimmed with the EEPROM trimming method.

Another prior art approach employs switched capacitors. In a switched capacitor technique the offsets of the amplifiers are "zeroed out." In a switched capacitor technique the error is held on a capacitor and is then subtracted out. The switched capacitor technique has the advantage of taking care of offset over temperature. A major disadvantage is that the switched capacitor technique requires large capacitors, a clock and a sequencing or control circuit to manage the auto-zero operation. The sizes of the required capacitors can be very significant and can prohibit the auto-zero technique from being employed in circuits that are either cost sensitive or area sensitive (or both). In addition, in the switched capacitor technique, noise is aliased down in frequency and creates some jitter on some types of circuits.

SUMMARY OF THE INVENTION

To address the above-discussed deficiencies of the prior art, it is a primary object of the present invention to provide a circuit for efficiently minimizing an offset voltage in an integrated circuit.

An advantageous embodiment of the present invention comprises an apparatus for minimizing an offset voltage in an amplifier circuit. The apparatus comprises first circuitry that operates the amplifier circuit in a first configuration during a first period of time to obtain a first value of offset voltage. The apparatus also comprises second circuitry that operates the amplifier circuit in a second configuration during a second period of time to obtain a second value of offset voltage. The second value of offset voltage has a polarity that is opposite to that of the first value of offset voltage.

The apparatus also comprises circuitry that averages the first value of offset voltage and the second value of offset voltage to obtain an average value of offset voltage. The average value of offset voltage is approximately zero volts. In this manner the apparatus of the present invention significantly minimizes the effects from the offset voltage in the amplifier circuit.

The apparatus of the present invention also comprises circuitry for switching the operation of the amplifier circuit from the first configuration to the second configuration and vice versa. In one advantageous embodiment the switching function is carried out by an input toggle switch and an internal toggle switch. The operation of the toggle switches may be controlled by a flip flop circuit. The apparatus of the present invention may be used in a number of different types of amplifier circuits. An amplifier circuit of the present invention is referred to as a flip flop zero (FFZ) amplifier circuit.

It is an object of the present invention to provide a system and method for providing a circuit for efficiently minimizing an offset voltage in an amplifier circuit.

It is also an object of the present invention to provide a system and method for providing a circuit for efficiently minimizing an offset voltage in a switching power supply circuit.

It is yet another object of the invention to provide a system and method for providing a circuit for efficiently minimizing an offset voltage by utilizing a flip flop zero (FFZ) amplifier circuit.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future, uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
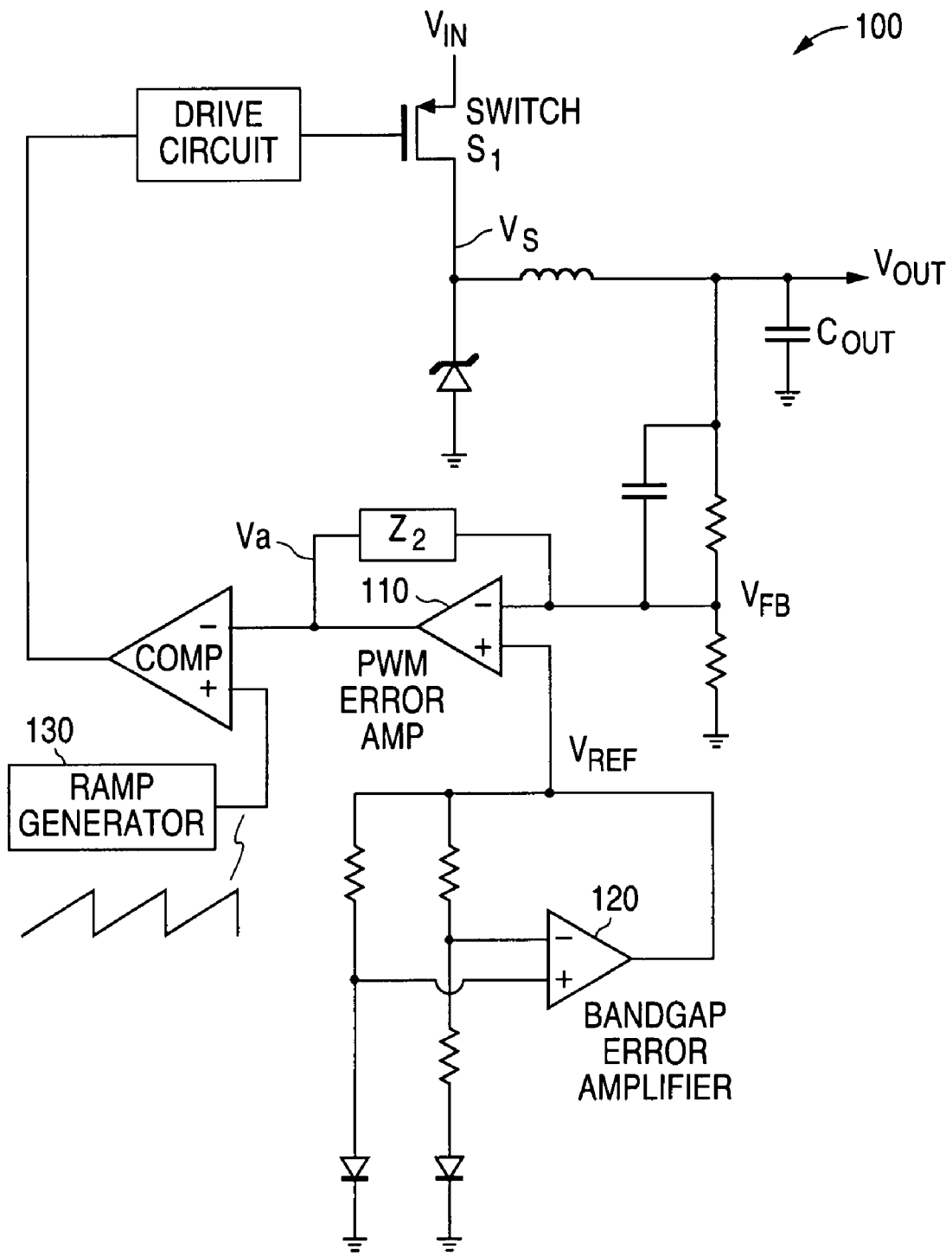
FIG. 1 is a block diagram illustrating a prior art voltage mode compensation switching power supply circuit.
Figure 2:
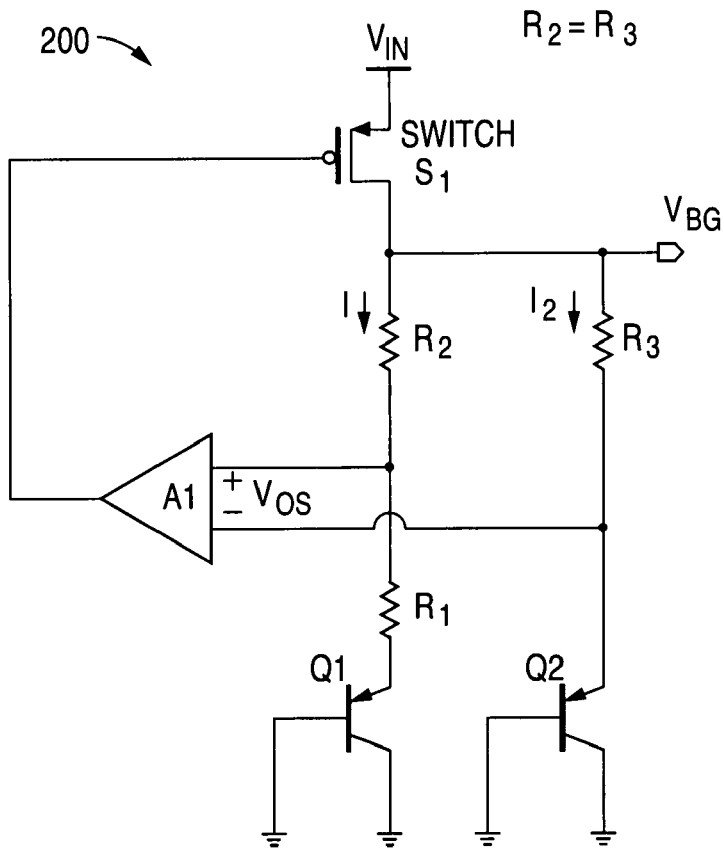
FIG. 2 is a block diagram illustrating a prior art complementary metal oxide semiconductor (CMOS) bandgap voltage reference circuit comprising terminal bipolar transistors.

FIGS. 3 through 7, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

Specifically, the offset voltage minimization circuit of the present invention will be described in connection with a switching power supply circuit. It is understood that the offset voltage minimization circuit of the present invention is not limited to use in switching power supply circuits but may also be used in other types of circuits that employ an inductor/capacitor filter circuit at the output that is capable of averaging the effects of switching between two offsets.

Because a switching power supply circuit has a regular repetitive period during normal operation, that period may be used to average the offset voltage for the PWM error amplifier and the bandgap error amplifier. This may be accomplished by replacing both the PWM error amplifier and the bandgap error amplifier with a flip flop zero (FFZ) amplifier 300 of the type shown in FIG. 3. Flip flop zero (FFZ) amplifier 300 is referred to as a "flip flop zero" amplifier because the input referred offset voltage for the amplifier changes (i.e., flip flops) with each switching cycle.

Flip flop zero (FFZ) amplifier 300 comprises an input toggle switch 310 and an internal toggle switch 320. Input toggle switch 310 is connected to a first portion 330 of FFZ amplifier 300. The output of the first portion 330 of FFZ amplifier 300 is connected to the input of internal toggle switch 320. Internal toggle switch 320 is connected to a second portion 340 of FFZ amplifier 300. The output of the second portion 340 of FFZ amplifier 300 is designated with the word "Output."

Input toggle switch 310 comprises a first set of two poles (each of which is designated with the letter "A") and a second set of two poles (each of which is designated with the letter "B"). When the input toggle switch 310 is in the "A" position, (1) input line 350 is connected to the noninverting input of the first portion 330 of FFZ amplifier 300 and (2) input line 360 is connected to the inverting input of the first portion 330 of FFZ amplifier 300. When the input toggle switch 310 is in the "B" position, (1) input line 350 is connected to the inverting input of the first portion 330 of FFZ amplifier 300 and (2) input line 360 is connected to the noninverting input of the first portion 330 of FFZ amplifier 300.

Internal toggle switch 320 also comprises a first set of two poles (each of which is designated with the letter "A") and a second set of two poles (each of which is designated with the letter "B"). When the internal toggle switch 320 is in the "A" position, (1) internal line 370 is connected to the noninverting input of the second portion 340 of FFZ amplifier 300 and (2) internal line 380 is connected to the inverting input of the second portion 340 of FFZ amplifier 300. When the internal toggle switch 320 is in the "B" position, (1) internal line 370 is connected to the inverting input of the second portion 340 of FFZ amplifier 300 and (2) internal line 380 is connected to the noninverting input of the second portion 340 of FFZ amplifier 300.

Figure 4:
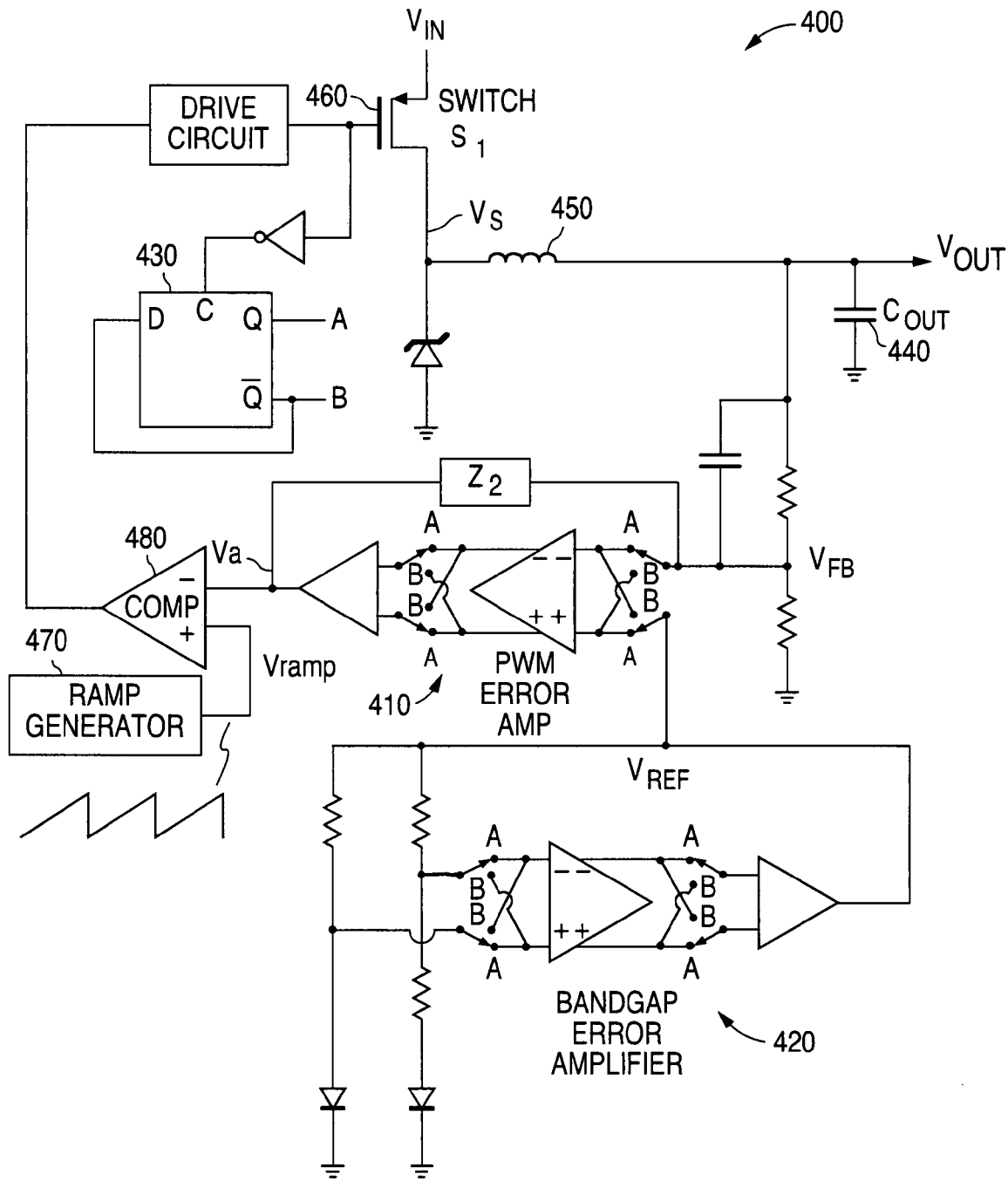
FIG. 4 is block diagram illustrating a voltage mode compensation switching power supply circuit comprising flip flop zero (FFZ) amplifiers of the present invention.

FIG. 4 illustrates a switching power supply circuit 400 that utilizes the flip flop zero (FFZ) amplifiers 300 of the present invention. Specifically The PWM error amplifier 410 comprises a flip flop zero (FFZ) amplifier 410 of the present invention. The bandgap error amplifier 420 also comprises a flip flop zero (FFZ) amplifier 420 of the present invention. A "D" type flip flop 430 is utilized to generate the switch signals "A" and "B" to switch the switches 310 and 320 of the flip flop (FFZ) amplifiers 410 and 420.

By toggling the switches 310 and 320 between the "A" state and the "B" state on each switching cycle, the offset voltage on a flip flop zero (FFZ) amplifier 300 averages zero over a period of two (2) cycles. On the first cycle, the switches 310 and 320 would be in the "A" position. On the second cycle, the switches 310 and 320 would be in the "B" position. Then on the next cycle, the switches would be back in the "A" position. The switches 310 and 320 continue to alternate between the "A" position and the "B" position.

This switching technique is similar to what is done in a chopper stabilizer amplifier. However, unlike the case of a chopper stabilizer amplifier, there are no capacitors and there are no attempts to hold the offset voltage. Instead the value of the offset voltage ($V_{OS}$) jumps from a positive value ($+V_{OS}$) on the first cycle to a negative value ($-V_{OS}$) on the second cycle. Then the value of the offset voltage jumps back to the positive value ($+V_{OS}$) on the third cycle, and so on.

The output capacitor 440 (designated $C_{OUT}$) of the switching power supply circuit 400, in conjunction with the inductor 450, simply averages the two values of the offset voltage ($+V_{OS}$ and $-V_{OS}$) over the two cycles. The result is zero offset voltage error from the PWM error amplifier 410 and zero offset voltage error from the bandgap error amplifier 420.

The approach of the present invention is significantly different than the prior art approaches. The present invention does not attempt to hold the existing offset voltage internally on hold capacitors. The present invention does not attempt to trim to zero the existing offset voltage. In the present invention the output capacitor 440 ($C_{OUT}$) and the output inductor 450 integrate the offset effects on the output voltage ($V_{OUT}$).

Figure 3:
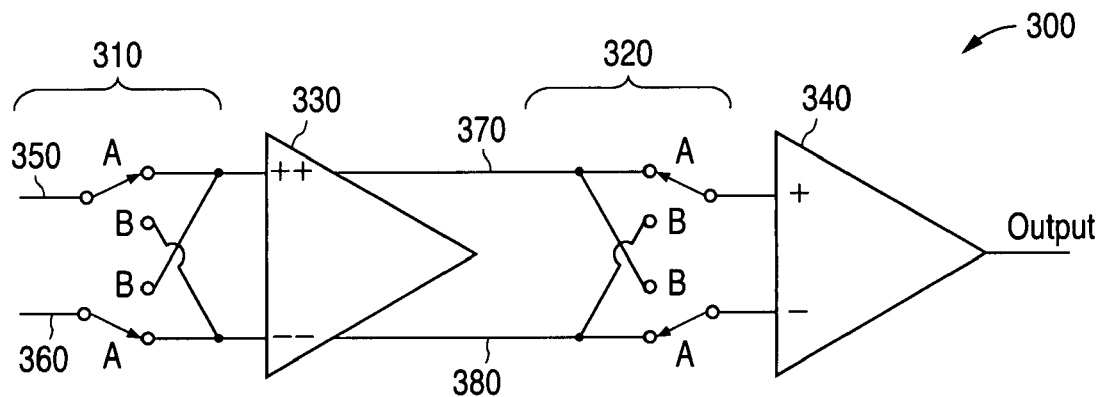
FIG. 3 is a block diagram illustrating an advantageous embodiment of a flip flop zero (FFZ) amplifier circuit of the present invention.
Figure 5:
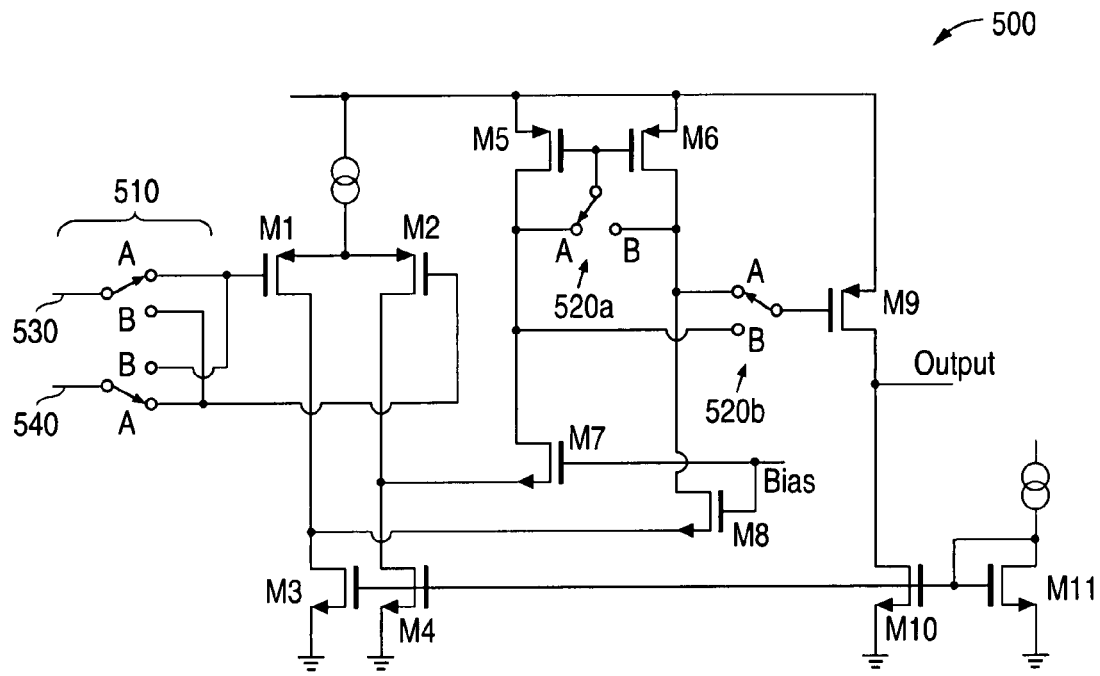
FIG. 5 is a block diagram illustrating an advantageous embodiment of a circuit for implementing the flip flop zero (FFZ) amplifier circuit shown in FIG. 3.

FIG. 5 illustrates an advantageous embodiment of a circuit 500 for implementing the flip flop zero (FFZ) amplifier circuit shown in FIG. 3. The embodiment shown in FIG. 5 is merely illustrative. It is understood that more than one circuit arrangement could be used to implement the flip flop zero (FFZ) amplifier circuit of the present invention. It is also understood that the concept and principles of the present invention are not limited to the embodiment that is shown in FIG. 5.

The embodiment of FFZ amplifier 500 that is shown in FIG. 5 comprises an input toggle switch 510 and an internal toggle switch 520 (comprising switch 520a and switch 520b). The embodiment of FFZ amplifier 500 that is shown in FIG. 5 also comprises input transistors M1 and M2, current source transistors M3 and M4, mirror transistors M5 and M6, cascode transistors M7 and M8, output transistor M9, and bias transistors M10 and M11.

When input toggle switch 510 is in the "A" position, input line 530 is connected to the gate of input transistor M1 and input line 540 is connected to the gate of input transistor M2. When input toggle switch 510 is in the "B" position, input line 530 is connected to the gate of input transistor M2 and input line 540 is connected to the gate of input transistor M1.

The internal toggle switch 520 comprises a first A-B switch 520a that alternately switches the commonly connected gates of mirror transistors M5 and M6 either to the drain of mirror transistor M5 or the drain of mirror transistor M6. The internal toggle switch 520 also comprises a second A-B switch 520b that alternately switches the drain of mirror transistor M5 or the drain of mirror transistor M6 to the gate of output transistor M9.

Input toggle switch 510 changes the polarity at the input of FFZ amplifier 500 and internal toggle switch 520 reverses the mirror (transistors M5 and M6) while connecting the output transistor M9 to the opposite nodes. When the switches are in the "A" position, the FFZ amplifier 500 has an offset voltage (Vosa) that is due to the mismatch between the input transistors M1 and M2, and the mismatch between the current source transistors M3 and M4, and the mirror transistors M5 and M6. All mismatches sum together to create the total offset for the FFZ amplifier 500.

During the "A" phase, the total offset polarity will be in one direction (polarity). During the "B" phase, the offset polarity will reverse. By toggling between the "A" phase and the "B" phase on alternate cycles, the average value of offset of the two cycles is approximately zero. This means that offset errors that are due to the PWM error amplifier 410 and the bandgap error amplifier 420 in switching power supply circuit 400 will be effectively eliminated from the total direct current (DC) to direct current (DC) switching power supply circuit error budget.

In the switching power supply circuit 400 shown in FIG. 4 inductor 450 and output capacitor 440 ($C_{OUT}$) serve to filter out the output voltage changes of the PWM error amplifier 410 and the bandgap reference amplifier 420 (as the voltage changes (i.e., flip flops) with each cycle. This means that a user of switching power supply circuit 400 will be unable to actually "see" the zeroing action in the output voltage ($V_{OUT}$).

The decision of when to "throw the switch" from the "A" state to the "B" state (and vice versa) is made using "D" type flip flop circuit 430 that is configured in a "divide by two" configuration. The inverted version of the switch signal from switch S1 (i.e., field effect transistor (FET) 460) is provided to a clock input (C) of the "D" type flip flop circuit 430. The inverted version of the switch signal from switch S1 (FET 460) changes the state of the flip flop zero switches (in PWM error amplifier 410 and in bandgap error amplifier 420) each time that switch S1 (FET 460) is turned on.

This means that the offset voltage will be changed at the same time that switch S1 (FET 460) starts a cycle. The switch timing (for states "A" and "B") is slaved to the switching of the power output switch (FET 460) so that the error in PWM error amplifier 410 and the error in bandgap error amplifier 420 have time to settle before the next switching decision must be made. Because turning on the power output switch (FET 460) disrupts that circuit (because of very large ground current/supply currents) any disruption in the output of the PWM error amplifier 410 due to the toggling of the flip flop zero (FFZ) switches in the PWM error amplifier 410 is insignificant.

The switching power supply circuit 400 receives the information on when to "throw the switch" from the gate of the field effect transistor (FET) 460 (switch S1). It is understood that the invention is not limited to this advantageous embodiment. The same information could be obtained from the ramp generator clock or from any point in the drive circuit.

Although the illustrative embodiment that is shown in FIG. 4 sequences the "flip flop zero" action to occur when the field effect transistor (FET) 460 (switch S1) turns on, the invention is not limited to this embodiment. The "flip flop zero" action may occur in the middle of the ramp or at any time on the ramp, as long as the period between the "flip" state (i.e., the first transition) is the same as the period between the "flop" state (i.e., the second transition). The circuitry will even average out voltage spike disruption.

The flip flop zero (FFZ) circuitry of the present invention may be used in different types of switching power supply circuits. For example, if the switching power supply circuit has a different type of topology such as a constant on time, the flip flop zero (FFZ) amplifier could be replaced by a flip flop zero (FFZ) comparator circuit. The technique of the present invention of using flip flop zero (FFZ) circuitry can work in all types of topologies. In particular, the flip flop zero (FFZ) circuitry of the present invention can work in a voltage mode compensation topology, or in a current mode compensation topology, or in a hysteretic topology. The flip flop zero (FFZ) circuitry will also work with a boost topology as well as with the buck topology that has been described.

Figure 6:
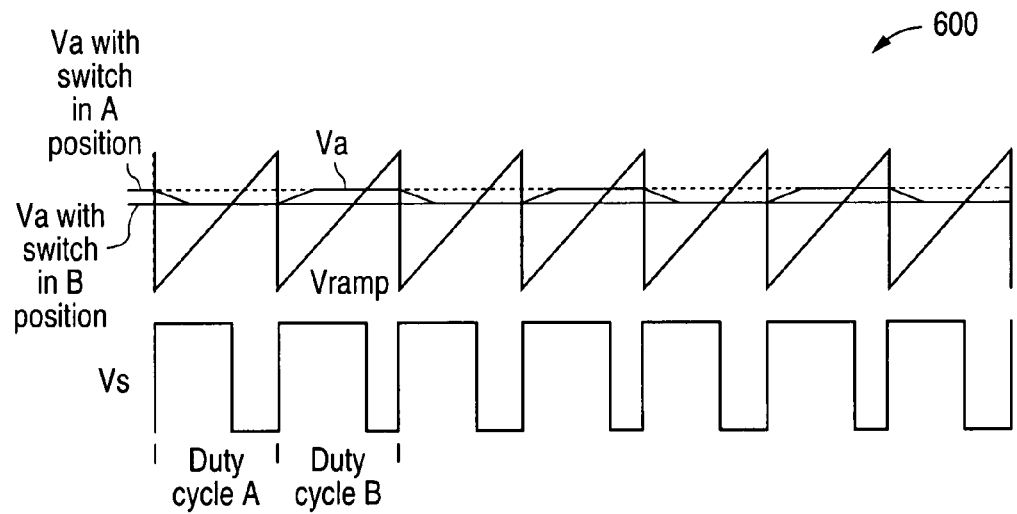
FIG. 6 is a timing diagram illustrating a waveform that represents the output of the pulse width modulation (PWM) Error Amplifier (Va) and a timing diagram illustrating a voltage waveform from the ramp generator (Vramp) shown in FIG. 5.

FIG. 6 is a timing diagram 600 illustrating a waveform that represents the output of the PWM error amplifier 410 (designated Va) and a timing diagram illustrating a voltage waveform from the ramp generator 470 (designated Vramp). The voltage Va varies as the switches change between the "A" state and the "B" state. These voltage changes drive the PWM comparator 480 to change states at alternately different points on the ramp. This, in turn, creates slightly different duty cycles (duty cycle "A" and duty cycle "B") at the switch node (designated Vs). The corresponding voltage at switch node Vs is also plotted in FIG. 6.

In the example shown in FIG. 6 the magnitude of the changes in the Va voltage and the resulting changes in the duty cycle are significantly enlarged in scale in order to illustrate how the circuitry of the present invention operates. In reality, the changes in the duty cycle of Vs would be very small and difficult to see on a drawing of the scale shown in FIG. 6.

The technique of the present invention for minimizing an offset voltage provides a significant improvement over the prior art switched capacitor auto zero technique. This is because there is no need in the present invention for the complexity of a switched capacitor control circuit. There is also no need for hold capacitors and the increased integrated circuit area that the hold capacitors would require. The technique of the present invention also avoids the problem of aliasing high band noise into the switching band.

In addition to avoiding the problems mentioned above, the technique of the present invention automatically eliminates the problem of assembly shift in the amplifiers. The technique of the present invention also eliminates the temperature coefficient of the offsets.

Figure 7:
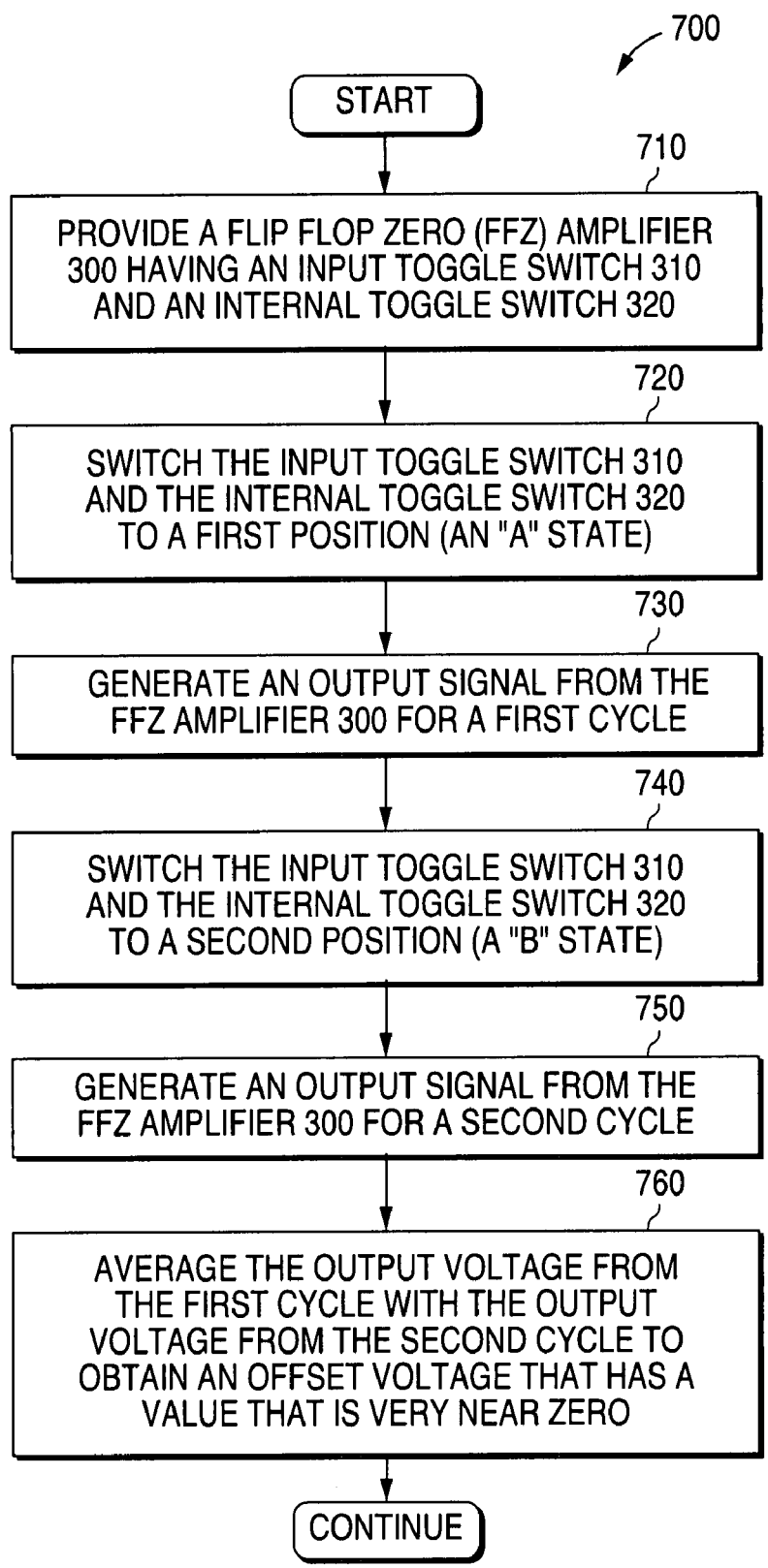
FIG. 7 is a flow chart illustrating an advantageous embodiment of a method of the present invention.

FIG. 7 is a flow chart 700 illustrating an advantageous embodiment of a method of the present invention. In the first step a flip flop zero (FFZ) amplifier 300 of the present invention is provided (step 710). As previously described, the FFZ amplifier 300 has an input toggle switch 310 and an internal toggle switch 320. The input toggle switch 310 and the internal toggle switch 320 are switched to a first position (an "A" state) (step 720).

Then the FFZ amplifier 300 is operated to generate an output signal over a first cycle (step 730). At the end of the first cycle the input toggle switch 310 and the internal toggle switch 320 are then switched to a second position (a "B" state) (step 740). Then the FFZ amplifier 300 is operated to generate an output signal over a second cycle (step 750). At the end of the second cycle the output voltage over the first cycle is averaged with the output voltage over the second cycle to obtain an offset voltage that has a value that is very near zero (step 760).

Although the present invention has been described in connection with an embodiment of a switching power supply circuit, it is understood that this embodiment is merely illustrative. It is understood that it is possible to practice the principles of the invention in other types of electronic circuitry depending upon the requirements of a particular application.

Although the present invention has been described with several embodiments, various changes and modifications may be suggested to one skilled in the art. It is intended that the present invention encompass such changes and modifications as fall within the scope of the appended claims.

What is claimed is:

1. An apparatus that comprises:
an amplifier circuit that comprises:
 a first portion and a second portion that can be operated in a first configuration and operated in a second configuration,
 wherein said first portion and said second portion each comprises an input transistor, a current source transistor, a mirror transistor, and a cascode transistor,
 wherein said first portion and said second portion of said amplifier circuit operate in said first configuration during a first period of time to obtain a first value of offset voltage, and
 wherein said first portion and said second portion of said amplifier circuit operate in said second configuration during a second period of time to obtain a second value of offset voltage that has a polarity that is opposite to that of said first value of offset voltage; and
 circuitry comprising a capacitor and an inductor, the circuitry operable to average said first value of offset voltage and said second value of offset voltage to obtain an average value of offset voltage.

2. The apparatus as set forth in claim 1 wherein said average value of offset voltage is approximately zero volts.

3. The apparatus as set forth in claim 1 wherein said first period of time comprises a first cycle of a regular repetitive period and said second period of time comprises a second cycle of said regular repetitive period.

4. The apparatus as set forth in claim 1 further comprising circuitry for switching an operation of said amplifier circuit from said first configuration to said second configuration and from said second configuration to said first configuration.

5. The apparatus as set forth in claim 4 wherein said circuitry for switching said operation of said amplifier circuit comprises an input toggle switch and an internal toggle switch.

6. The apparatus as set forth in claim 4 further comprising a switch circuit for switching said operation of said amplifier circuit to one of: said first configuration and said second configuration.

7. The apparatus as set forth in claim 6 wherein said switch circuit comprises a flip flop circuit.

8. The apparatus as set forth in claim 1 wherein said amplifier circuit comprises one of: a pulse width modulation error amplifier circuit and a bandgap error amplifier circuit.

9. An apparatus that is capable of minimizing an offset voltage of an amplifier circuit, wherein said amplifier circuit comprises:
 a first portion and a second portion that can be operated in a first configuration and operated in a second configuration,
 wherein said first portion and said second portion each comprises an input transistor, a current source transistor, a mirror transistor, and a cascode transistor,
 wherein said first portion and said second portion of said amplifier circuit operate in said first configuration during a first period of time to obtain a first value of offset voltage, and
 wherein said first portion and said second portion of said amplifier circuit operate in said second configuration during a second period of time to obtain a second value of offset voltage that has a polarity that is opposite to that of said first value of offset voltage; and
 averaging circuitry comprising a capacitor and an inductor, the averaging circuitry operable to average said first value of offset voltage and said second value of offset voltage to obtain a minimized average value of offset voltage.

10. The apparatus as set forth in claim 9 wherein said flip flop zero amplifier circuit comprises one of: a pulse width modulation error amplifier circuit and a bandgap error amplifier circuit.

11. The apparatus as set forth in claim 9, wherein said averaging circuitry averages a positive value of said offset voltage of said amplifier circuit over a first period of time and a negative value of said offset voltage of said amplifier circuit over a second period of time to obtain the average value of offset voltage that is approximately zero volts.

12. The apparatus as set forth in claim 9, wherein said amplifier circuit comprises an input toggle switch and an internal toggle switch for switching said first portion and said second portion to said first configuration for obtaining a positive value of said offset voltage and to said second configuration for obtaining a negative value of said offset voltage.

13. A method for minimizing an offset voltage in an amplifier circuit, said method comprising the steps of:
 operating a first portion and a second portion of said amplifier circuit in a first configuration during a first period of time to obtain a first value of offset voltage, wherein a first portion and said second portion of said amplifier circuit each comprises an input transistor, a current source transistor, a mirror transistor, and a cascode transistor;
 operating said first portion and said second portion of said amplifier circuit in a second configuration during a second period of time to obtain a second value of offset voltage that has a polarity that is opposite to that of said first value of offset voltage; and
 averaging said first value of offset voltage and said second value of offset voltage with a circuit comprising a capacitor and an inductor to obtain an average value of offset voltage.

14. The method as set forth in claim 13 wherein said average value of offset voltage is approximately zero volts.

15. The method as set forth in claim 13 wherein said first period of time comprises a first cycle of a regular repetitive period and said second period of time comprises a second cycle of said regular repetitive period.

16. The method as set forth in claim 13 further comprising the step of:
 alternately switching an operation of said amplifier circuit from said first configuration to said second configuration and from said second configuration to said first configuration.

17. The method as set forth in claim 16 further comprising the step of:
 utilizing a switch circuit to control said alternate switching of said operation of said amplifier circuit between said first configuration and said second configuration.

18. The method as set forth in claim 13 wherein said amplifier circuit comprises one of: a pulse width modulation error amplifier circuit and a bandgap error amplifier circuit.

19. The method as set forth in claim 16 further comprising the step of:
   utilizing an input toggle switch and an internal toggle switch to control said alternate switching of said operation of said amplifier circuit between said first configuration and said second configuration.

20. The method as set forth in claim 16 further comprising the step of:
   utilizing a flip flop circuit to control said alternate switching of said operation of said amplifier circuit between said first configuration and said second configuration.

21. A switching power supply circuit that comprises at least one apparatus that minimizes an offset voltage of an amplifier circuit, wherein said amplifier circuit comprises:
   a first portion and a second portion that can be operated in a first configuration and operated in a second configuration;

wherein said first portion and said second portion each comprises an input transistor, a current source transistor, a mirror transistor, and a cascode transistor, wherein said first portion and said second portion of said amplifier circuit operate in said first configuration during a first period of time to obtain a first value of offset voltage;

wherein said first portion and said second portion of said amplifier circuit operate in said second configuration during a second period of time to obtain a second value of offset voltage that has a polarity that is opposite to that of said first value of offset voltage; and circuitry comprising a capacitor and an inductor, the circuitry operable to average said first value of offset voltage and said second value of offset voltage to obtain an average value of offset voltage.

* * * * *